United States Patent [19]

Konno

[11] Patent Number: 5,801,972

[45] Date of Patent: Sep. 1, 1998

[54] INDIVIDUAL TEST PROGRAM PRODUCING SYSTEM

[75] Inventor: Yoshihiro Konno, Tokyo, Japan

[73] Assignee: NEC Corporation, Tokyo, Japan

[21] Appl. No.: 905,997

[22] Filed: Aug. 4, 1997

[30] Foreign Application Priority Data

Aug. 2, 1996 [JP] Japan .................................. 8-220398

[51] Int. Cl.$^6$ .................................................. G06F 11/28
[52] U.S. Cl. .................. 364/579; 371/22.1; 371/27.1; 371/21.1; 371/22.3; 365/200; 365/201; 395/183.06
[58] Field of Search ....................... 364/579; 371/21.1, 371/21.3, 22.1, 22.3, 27.1; 365/200, 201; 395/183.06

[56] References Cited

U.S. PATENT DOCUMENTS

| | | | |
|---|---|---|---|
| 4,293,950 | 10/1981 | Shimizu et al. | 371/21.1 |
| 5,150,044 | 9/1992 | Hashizume et al. | 371/22.3 |
| 5,341,096 | 8/1994 | Yamamura | 371/22.3 |
| 5,432,797 | 7/1995 | Takano | 371/27.1 |
| 5,481,549 | 1/1996 | Tokyama | 371/27.1 |
| 5,701,306 | 12/1997 | Arai | 371/22.1 |
| 5,704,033 | 12/1997 | Park | 395/183.06 |

FOREIGN PATENT DOCUMENTS

| | | |
|---|---|---|
| 63-26580 | 2/1988 | Japan . |
| 6-75821 | 3/1994 | Japan . |

*Primary Examiner*—James P. Trammell
*Assistant Examiner*—Hien Vo
*Attorney, Agent, or Firm*—Sughrue, Mion, Zinn, Macpeak & Seas, PLLC

[57] ABSTRACT

A test program producing device including a test item information producing unit for reading circuit information, macro to be tested information and a library to produce necessary information regarding test items for an LSI to be examined, a test possibility/impossibility determining unit for calculating a total capacity of an object of a test pattern in a test program to be produced and comparing the total capacity of the object with a memory capacity of a testing device which executes a test for the LSI to be examined to determine whether a test is possible or not based on comparison results, and an individual test program producing unit for embedding information regarding test items in a model of a test program when determination is made that a test is possible, to produce a test program for use in an individual test of the LSI to be examined.

15 Claims, 9 Drawing Sheets

INDIVIDUAL TEST PROGRAM PRODUCING SYSTEM

BACKGROUND OF THE INVENTION

1. Field of the Invention

The present invention relates to a test program producing device which produces a test program for use in testing large-scale integrated circuits (LSI) and a producing method thereof and, more particularly, to a test program producing device characterized in its method of producing a program portion for conducting an individual test for each LSI to be examined and a producing method thereof.

2. Description of the Related Art

A test program for controlling a tester for use in testing an LSI includes a main test program for controlling general operation and an individual test program for executing individual test contents for each LSI as a device to be examined. It is a common practice in producing a test program of this kind to manually prepare all the information regarding classification of LSIs to be examined.

Conventionally proposed method of producing a test program of this kind is realized by preparing a test program for each test element in advance and extracting a necessary test element according to a kind of LSI to be examined to efficiently produce a test program for each LSI. Test program producing devices which realize a conventional test program producing method of this kind are disclosed, for example, in Japanese Patent Laying-Open (Kokai) No. Showa 63-26580, entitled "LSI Testing Device" and Japanese Patent Laying-Open (Kokai) No. Heisei 6-75821, entitled "Logical Device Testing System".

Japanese Patent Laying-Open (Kokai) No. Showa 63-26580 recites a device including, for the purpose of automatically identifying kinds of LSIs to be examined to organize a test program, an identification signal generating means for generating an identification signal according to a kind of LSI to be examined, an identification signal accepting means for accepting said identification signal, a common test program storing means for storing a test program common to the LSIs to be examined, and a test program organizing means for organizing said common test program into a test program corresponding to a kind of an LSI to be examined based on an identification signal of said LSI to be examined.

Japanese Patent Laying-Open (Kokai) No. Heisei 6-75821 recites a device including, for the purpose of facilitating production of a highly efficient and flexible test program and executing alteration and modification of the test program with ease and in a short time period, storage means provided at a plurality of microprocessors for controlling each circuit in a device to be examined and in advance storing a plurality of test elements whose evaluation tests have been completed, a starting means for externally starting said plurality of microprocessors, and an input means for externally receiving input, for said microprocessor started by said starting means, of an execution procedure of said test element and data to be applied to said test element.

In the above-described conventional test program producing methods, manual production of an individual test program according to a kind of LSI to be examined is realized in general by extracting a macro to be tested so as to correspond to a pin number of a tester and embedding the extracted macro in a corresponding part of a model of a test program. Then, when the increase in scale of LSI and the complication of the same cause an increase in the number of test items, test patterns and scan paths or create a need of such new test items as scan path length information, scan path switching information, LSI operating rate information, memory information, consumed power information, information by classification of clocks, signal level information, and reinforced power supply/reinforced ground information, these information is also manually produced and embedded in a model of a test program.

In the above-described conventional test program producing methods, however, the number of test patterns, which is increased with an increase in scale of LSI and complication of the same, in some cases exceeds the number of addresses recognizable by a test program. To reduce the number of addresses, therefore, processing of reducing the number of test patterns and the number of patterns is needed, which results in deterioration of program development efficiency.

In the conventional test program producing methods, in addition, since test patterns are often produced on a basis of a sub-block of LSI and on a basis of a test item and the number of test patterns is accordingly increased, these numerous test patterns are in some cases converted into one pattern object in a lump at the time of testing. When an LSI test by the one pattern object results in NG (defective), it requires much time to identify a pattern of the defective portion or identify at which test item the test goes defective.

Moreover, the conventional test program producing methods employ, as memory information to be integrated into a test program, such information as locating position of a memory macro, the number of read data and output load of read data. Then, as to memory macro name and locating position and a read data pin name of each macro, each of them is fixed under designing constraints and taken out from a net list. On the other hand, information regarding output load of read data should be calculated by delay analyses based on a wire length and a specified value of read data and produced in consideration of a macro name of a memory and the order of read data pins of the respective macros. Production of output load of read data therefore requires much labor.

In addition, although recent increase in scale of LSI and complication of the same make such information for use in an LSI test also necessary for a test as scan path length information, operating rate information, memory information, consumed power information, information by classification of clocks, scan path switching information and terminal signal level information, these information is all calculated from separate parameters and there is therefore no efficient manner of integrating them into a test program.

SUMMARY OF THE INVENTION

An object of the present invention is to provide a test program producing device capable of automatically obtaining various information regarding necessary test items and automatically producing individual test programs according to kinds of LSIs to be examined to reduce labor necessary for program development, and a test program producing method therefor.

Another object of the present invention is to provide a test program producing device capable of calculating a total of memory capacity of a pattern object to be tested to automatically determine whether the test is possible or impossible, and a test program producing method therefor.

A further object of the present invention is to provide a test program producing device capable of inserting address information of a pattern object into an individual test program to immediately detect a test pattern causing a test to be NG (defective), and a test program producing method therefor.

According to the first aspect of the invention, in a test of an LSI, a test program producing device for producing a test program for use in an individual test of an LSI to be examined, comprises test item information producing means for reading at least circuit information including information regarding concrete circuit specifications of an LSI to be examined, macro to be tested information which describes test items for each macro, and a necessary library, to produce necessary information regarding test items for said LSI to be examined;

test possibility/impossibility determining means for calculating a total capacity of an object of a test pattern in a test program to be produced and comparing the total capacity of the object with a memory capacity of a testing device which executes a test for said LSI to be examined to determine whether the test is possible or not based on the comparison results; and individual test program producing means for, when determination is made by said test possibility/impossibility determining means that a test is possible, embedding information regarding test items produced by said test item information producing means in a model of a test program prepared in advance to produce a test program for an individual test of said LSI to be examined.

The test item information producing means may obtain at least a corresponding relationship between a pattern address of a test pattern at a pattern object and a pattern address of a test pattern which is yet to be converted into a pattern object to obtain respective start addresses and end addresses of a plurality of test patterns to be executed by a produced test program.

In the preferred construction, the test program producing device further comprises scan path design determining means for determining whether said LSI to be examined is of scan path design and when said LSI is of scan path design, calculating the number of scan path bits of each scan path to calculate a scan path switching address of a pattern object, and memory mounting determining means for determining whether an internal memory is mounted on said LSI to be examined or not and when an internal memory is mounted, calculating a coordinate position of the internal memory in the LSI, counting the number of read data of a memory macro and further obtaining a wire length for the memory macro, wherein said individual test program producing means embeds, in addition to the information produced by said test item information producing means, scan path length information and scan path switching address information calculated by said scan path design determining means, and memory macro location information, number of read data information and read data wire length information obtained by said memory mounting determining means in said test program model.

According to the second aspect of the invention, in a test of an LSI, a test program producing method of producing a test program for use in an individual test of an LSI to be examined, comprising the steps of:

reading at least circuit information including information regarding concrete circuit specifications of an LSI to be examined, macro to be tested information which describes test items for each macro, and a necessary library, to produce necessary information regarding test items for said LSI to be examined;

calculating a total capacity of an object of a test pattern in a test program to be produced and comparing the total capacity of the object with a memory capacity of a testing device which executes a test for said LSI to be examined to determine whether the test is possible or not based on the comparison results; and when determination is made by said test possibility/impossibility determining means that a test is possible, embedding information regarding test items produced by said test item information producing means in a model of a test program prepared in advance to produce a test program for an individual test of said LSI to be examined.

In the preferred construction, at said test item information producing step, at least a corresponding relationship between a pattern address of a test pattern at a pattern object and a pattern address of a test pattern which is yet to be converted into a pattern object is obtained to obtain respective start addresses and end addresses of a plurality of test patterns to be executed by a produced test program.

In the preferred construction, the test program producing method further comprises between said test item information producing step and said test possibility/impossibility determining step, the steps of:

determining whether an internal memory is mounted on said LSI to be examined, when an internal memory is mounted on said LSI, calculating a coordinate position of the internal memory in the LSI, counting the number of read data of a memory macro, and obtaining a wire length for the memory macro, wherein
at said individual test program producing step, memory macro location information calculated at said internal memory coordinate position calculating step, number of read data information obtained at said number of read data counting step, and read data wire length information obtained at said wire length obtaining step is embedded in said test program model, in addition to the information produced at said test item information producing step.

Also, the test program producing method further comprises between said test item information producing step and said test possibility/impossibility determining step, the steps of:

determining whether said LSI to be examined is of scan path design, calculating the number of scan path bits of each scan path when the LSI is of scan path design, and calculating a scan path switching address of a pattern object, and further comprising the steps of:
determining whether an internal memory is mounted on said LSI to be examined,
when an internal memory is mounted on said LSI, calculating a coordinate position of the internal memory in the LSI,
counting the number of read data of a memory macro, and
obtaining a wire length for the memory macro, wherein
at said individual test program producing step, scan path length information calculated at said scan path bit calculating step, scan path switching address information calculated at said scan path switching address calculating step, memory macro location information obtained at said internal memory coordinate position calculating step, number of read data information obtained at said number of read data counting step and read data wire length information obtained at said wire length obtaining step is embedded in said test program model, in addition to the information produced at said test item information producing step.

According to a further aspect of the invention, in a test of an LSI, a computer readable memory which stores a control program for controlling a test program producing device which produces a test program for use in an individual test of an LSI to be examined, said control program comprising the steps of:

reading at least circuit information including information regarding concrete circuit specifications of an LSI to be examined, macro to be tested information which describes test items for each macro, and a necessary library, to produce necessary information regarding test items for said LSI to be examined;

calculating a total capacity of an object of a test pattern in a test program to be produced and comparing the total capacity of the object with a memory capacity of a testing device which executes a test for said LSI to be examined to determine whether the test is possible or not based on the comparison results; and when determination is made at said test possibility/ impossibility determining step that a test is possible, embedding information regarding test items produced by said test item information producing means in a model of a test program prepared in advance to produce a test program for an individual tesst of said LSI to be examined Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENTS

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, wellknown structures are not shown in detail in order to unnecessarily obscure the present invention.

Figure 1:
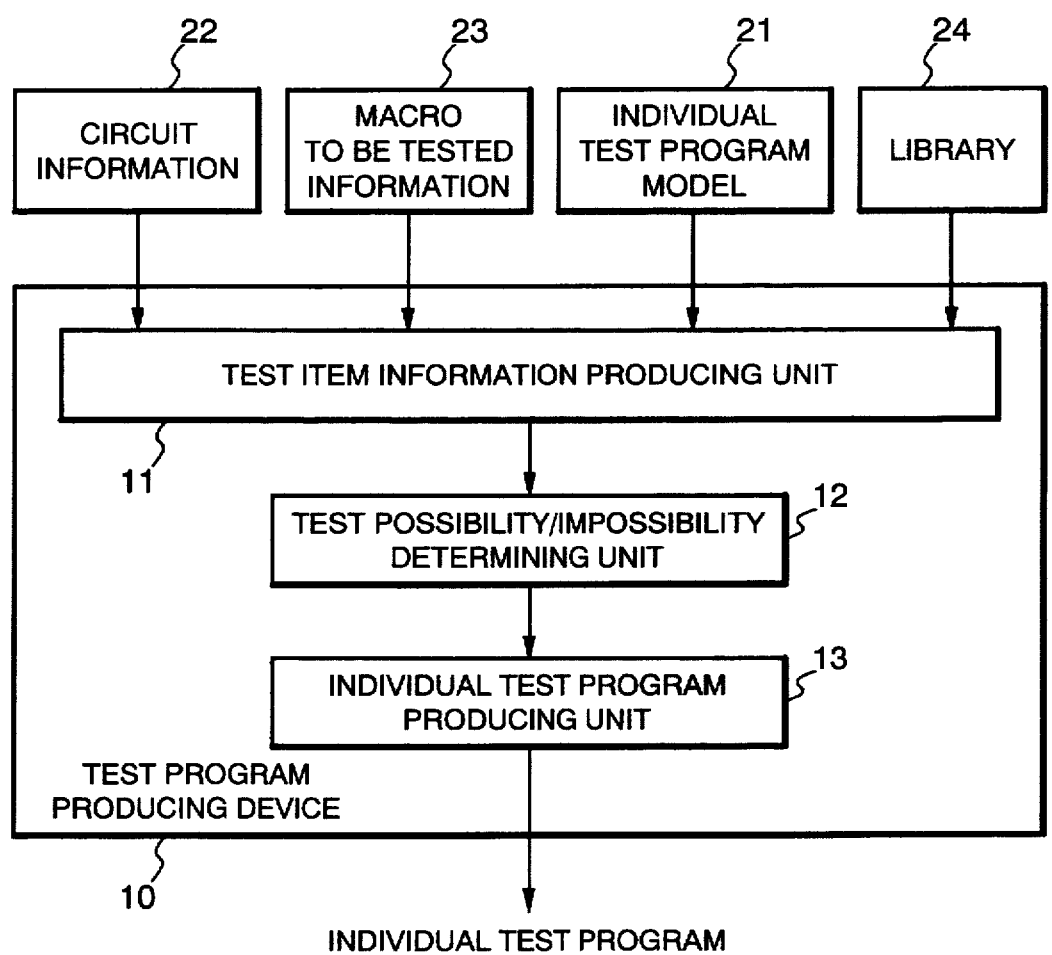
FIG. 1 is a block diagram showing structure of a test program producing device according to a first embodiment of the present invention.

FIG. 1 is a block diagram showing structure of a test program producing device according to a first embodiment of the present invention.

As illustrated in the figure, a test program producing device 10 of the present embodiment includes a test item information producing unit 11 for extracting and producing information regarding test items from various information, a test possibility/impossibility determining unit 12 for determining whether the size of a test pattern is too large or not, and an individual test program producing unit 13 for producing individual test programs by using information produced by the test item information producing unit. In FIG. 1, illustration is made only of a characteristic part of the structure of the present invention and that of the remaining common part is omitted.

In the above-described structure, the test item information producing unit 11, the test possibility/impossibility determining unit 12 and the individual test program producing unit 13 are implemented by computer-program-controlled CPU and internal memory such as a RAM. The computer program is supplied as storage in a storage medium such as a magnetic disk or a semiconductor memory. Loading the computer program into the internal memory realizes the respective function executing units of the present embodiment.

Although the test program producing device 10 shown in FIG. 1 includes only the components for use in the production of an individual test program to be prepared according to a kind of LSI to be examined, the device may include components for use in producing a main test program which is a part of the test program independent of a kind of LSI to be examined. The illustrated test program producing device 10 may also be structured as a part of a tester. In other words, while the individual test program producing device 10 of the present embodiment may, as a separate device, produce an individual test program and supply the same to a tester, the device may be integrated into a tester to produce an individual test program according to a kind of LSI to be examined at the time of testing an LSI. The individual test program produced according to the present embodiment is executed together with a main test program at a tester to test the LSI to be examined.

Figure 9:
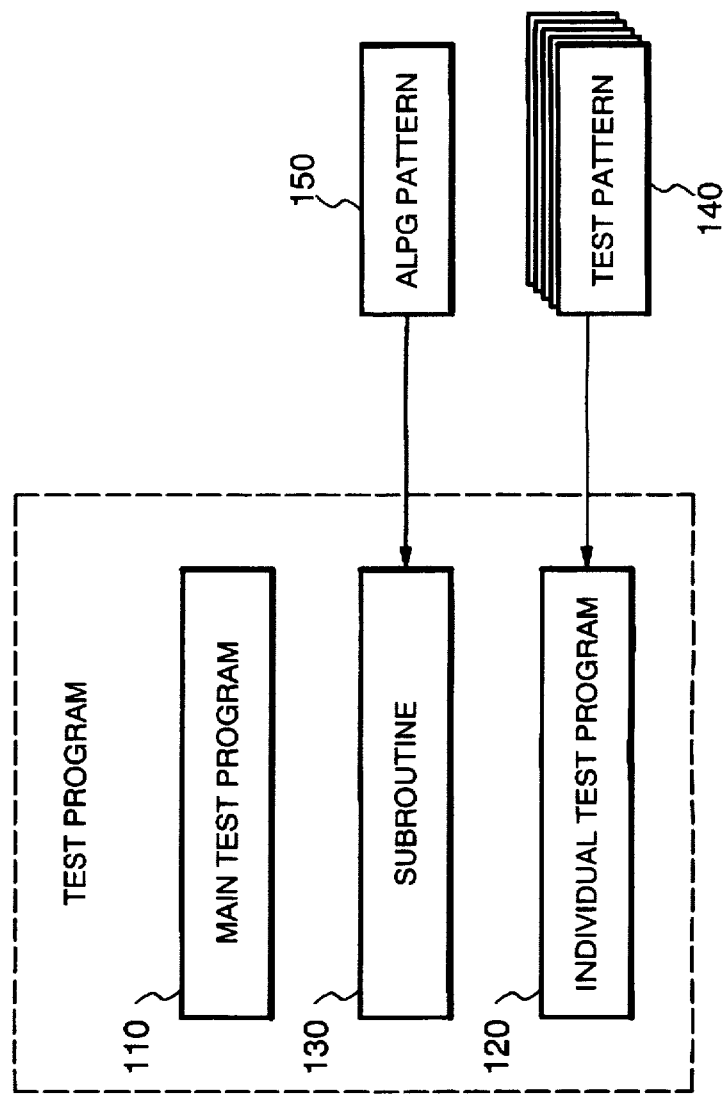
FIG. 9 is a schematic diagram showing structure of a test program produced by the test program producing device of the present invention.

Description will be here made of structure of a test program produced by the test program producing device 10 of the present embodiment. FIG. 9 is a schematic diagram showing structure of a test program.

As shown in FIG. 9, a test program 100 is structured to include a main test program 110, an individual test program 120 and a subroutine 130 and read and execute a plurality of test patterns 140 and an ALPG (Algorithmic Pattern Generator) pattern 150.

The main test program 110, which describes common specifications such as the order of test items, voltage/current values, a test pattern for clock and a test pattern for a common circuit, can be shared irrespective of kinds of LSIs to be examined. It is therefore unnecessary to produce the program every time LSI is tested and possible to make use of a part of the main test program 110 in the existing test program 100.

The individual test program 120 describes, as a test program, an individual test item for each kind of LSI such as pin information of an individual LSI, operating rate, consumed power, a scan path length and a test pattern address. Then, under the control of the main test program 110, the individual test program 120 executes a test of LSI using the test pattern 140. The individual test program 120 therefore should be produced individually according to a kind and an object of using an LSI to be examined every time a tester tests the LSI.

When a memory is mounted on a designed LSI (LSI to be examined), the individual test program 120 describes memory information. Then, the main test program 110 calls the subroutine 130 for testing the mounted memory to conduct a test of the memory by using the ALPG pattern 150 corresponding to the memory (e.g. marching and galloping). Also in this case, the corresponding individual test program 120 will be individually produced depending on whether the memory is mounted on the LSI to be examined.

The test item information producing unit 11 constituting the test program producing device 10 of the present embodiment receives input of a model 21 of an individual test program which contains only a flow and specifications of test items but not individual information for each LSI, as well as receiving input, as necessary, circuit information 22, macro to be tested information 23 and a library 24 to produce information regarding test items necessary for the production of an individual test program.

The circuit information 22 to be input to the test item information producing unit 11 includes, for example, a net list of a circuit, consumed power information, operating rate information, pin position information, reinforced power supply and reinforced ground pin information, pattern object information, scan FF order information, scan path information and layout information. The macro to be tested information 23 contains test items for each macro. In the library 24, stored are, for example, a tester pin library, a clock macro, an I/O macro, and kinds of memory macro. While, the contents of the circuit information 22 differ with a kind of LSI, those of the individual test program model 21, the macro to be tested information 23 and the library 24 are common with the same technology.

The test possibility/impossibility determining unit 12 determines whether a test pattern overflows a memory capacity of an LSI tester based on pattern object information extracted from the circuit information 22 by the test item information producing unit 11. Then, when no overflow occurs, the unit 12 shifts processing to the individual test program producing unit 13 and when an overflow occurs, the unit 12 interrupts production of the individual test program.

When the determination is made by the test possibility/impossibility determining unit 12 that no overflow occurs, the individual test program producing unit 13 embeds, in the model 21 of the individual test program, pins to be tested, reinforced power supply and reinforced ground information, start and end addresses of each test pattern, information by classification of clocks, operating rate information and signal level information obtained and allotted to each test item by the test item information producing unit 11, to complete the individual test program 50.

Figure 2:
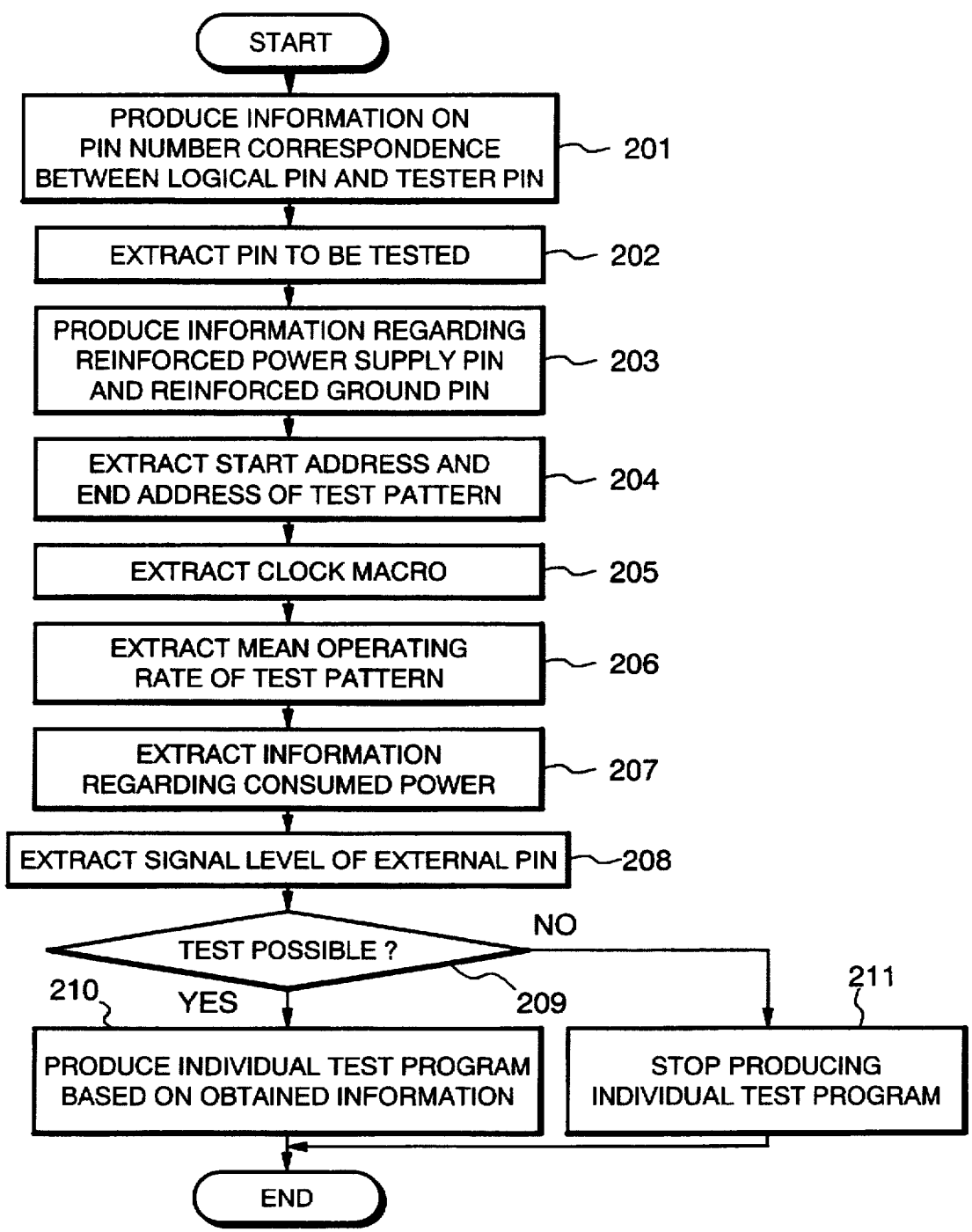
FIG. 2 is a flow chart showing operation of the first embodiment.

Description will be next made of an individual test program producing procedure according to the present embodiment with reference to the flow chart of FIG. 2.

With reference to FIG. 2, first, the test item information producing unit 11 produces information regarding necessary test items. More specifically, the unit 11 extracts LSI pin position information indicative of a correspondence between LSI pin position information and a logical pin from the circuit information 22 and obtains a tester pin library indicative of a correspondence of tester pin number from the library 24 to obtain a pin number correspondence between a logical pin and a tester pin (Step 201). Next, the unit 11 traces an external pin on the net list of the circuit information 22 and obtains an input buffer, an output buffer and a bidirectional buffer to allot to each test item defined by the macro to be tested information 23 (Step 202). Then, the unit 11 converts a reinforced power supply pin and a reinforced ground pin indicated in the pin position information obtained from the circuit information 22 into tester pin numbers by using the tester pin library of the library 24 (Step 203). Next, based on the pattern object information of the circuit information 22, the unit 11 obtains the respective start addresses and end addresses of a plurality of test patterns to be executed (Step 204). Then, the unit 11 extracts a clock macro in the net list of the circuit information 22 from the clock library of the library 24 (Step 205). Next, the unit 11 extracts a mean operating rate of each one of the test patterns from simulation results included in the pattern object (Step 206). The unit 11 then extracts consumed power information from the circuit information 22 (Step 207). Next, the unit 11 extracts a signal level of a macro of the external pin in the net list of the circuit information 22 from the I/O macro of the library 34 (Step 208).

The foregoing production of information regarding test items needs not to be executed in the above-described order but may be executed in any proper order. The respective steps may be executed in parallel. In addition, while at least acquisition of a pin number correspondence between a logical pin and a tester pin at Step 201, allotment of a test pin to each test item at Step 202 and acquisition of a start address and an end address of a test pattern at Step 204 should be conducted without fail, other information production may be arbitrarily and selectively conducted according to test contents determined based on a kind of LSI and an object of using an LSI.

Next, the test possibility/impossibility determining unit 12 determines whether a test pattern overflows a memory capacity of an LSI tester based on the pattern object information of the circuit information 22 (Step 209). If no overflow occurs, the individual test program producing unit 13 embeds each information obtained by the processing up to Step 208 in the model 21 of the individual test program and produces and outputs the individual test program (Step 210). On the other hand, when the test pattern overflows the memory capacity of the LSI tester, the unit 13 interrupts production of the individual test program (Step 211).

By thus automatically obtaining individual information for use in an LSI test and embedding the information in a model of an individual test program, the test program producing device 10 of the present embodiment enables production of individual test programs according to kinds of LSIs to be examined. In addition, since information to be embedded in a model of an individual test program can be arbitrarily selected, the device is allowed to deal with a wide variety of LSIs to be examined with ease.

Figure 3:
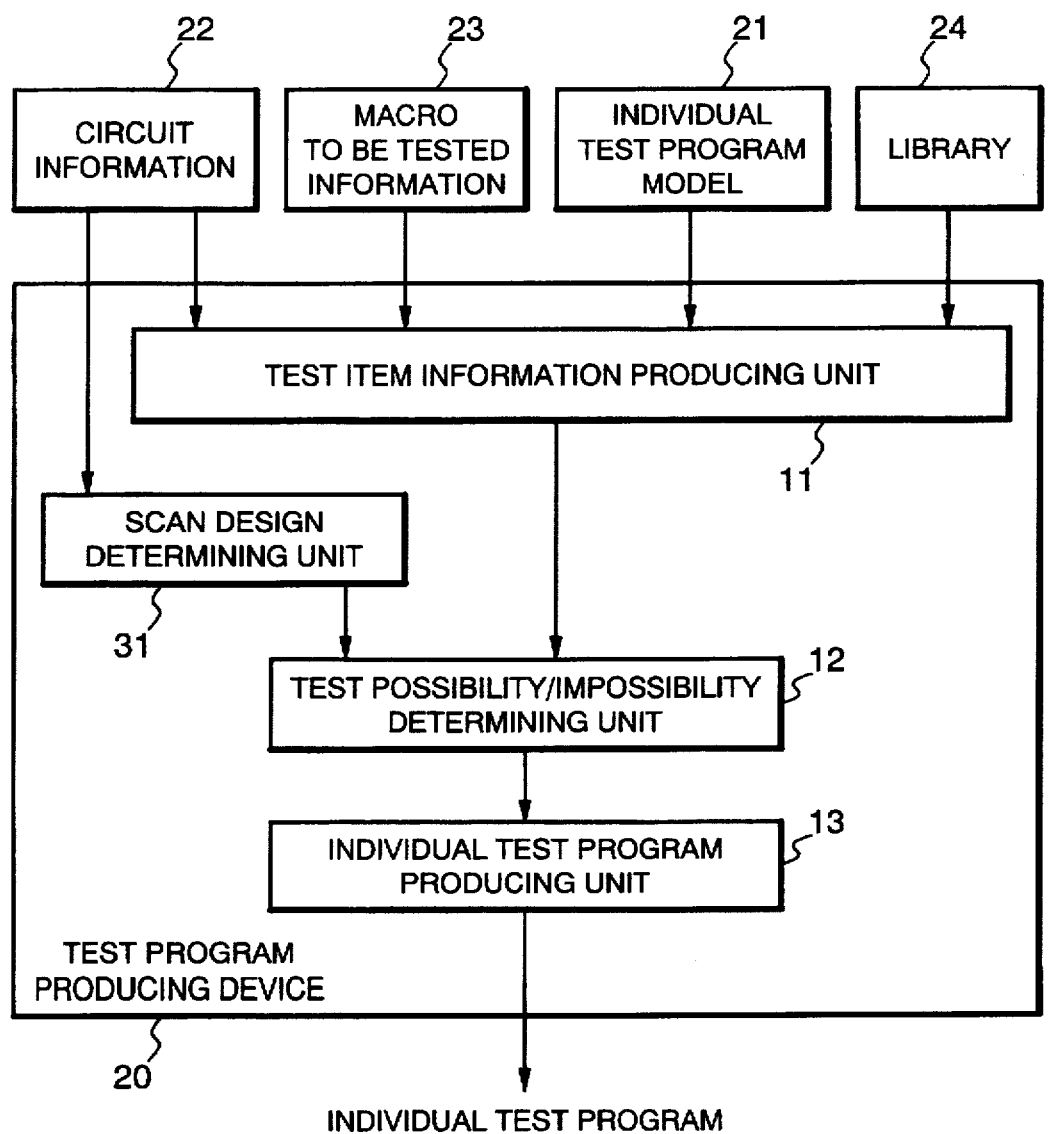
FIG. 3 is a block diagram showing structure of a test program producing device according to a second embodiment of the present invention.

FIG. 3 is a block diagram showing structure of an individual test program producing device according to another embodiment of the present invention.

As illustrated in the figure, a test program producing device 30 of the present embodiment includes a test item information producing unit 11 for extracting and producing information regarding test items from various information, a scan path design determining unit 31 for determining whether an LSI to be examined is of scan path design to conduct necessary processing, a test possibility/impossibility determining unit 12 for determining whether the size of a test pattern is too large or not, and an individual test program producing unit 13 for producing an individual test program by using information produced by the test item information producing unit. In FIG. 3, illustration is made only of a characteristic part of the structure of the present invention and that of the remaining common part is omitted.

The scan path design determining unit 31, like the other components, is implemented by computer-program-controlled CPU and internal memory such as a RAM. Here, scan path system is to connect flip-flops in an LSI like a shift register (scan path) to receive input of a test signal through an external terminal and read operation results of a combinational circuit portion through the flip-flops connected like a shift register, thereby performing a test with ease.

When determination is made that an LSI to be examined is of scan path design, the scan path design determining unit 31 calculates a scan path length of each path based on the connection order of scan flip-flops (hereinafter referred to as scan FF) and further calculates a switching address of a scan path at a tester based on pattern object information and scan path information.

The test item information producing unit 11, the test possibility/impossibility determining unit 12 and the individual test program producing unit 13 are the same as their counterparts in the first embodiment which have been described with reference to FIG. 1 and therefore allotted the same reference numerals to omit their description. Structure of a test program produced according to the present embodiment is also the same as that of the test program which has been described in the first embodiment and shown in FIG. 9.

Figure 4:
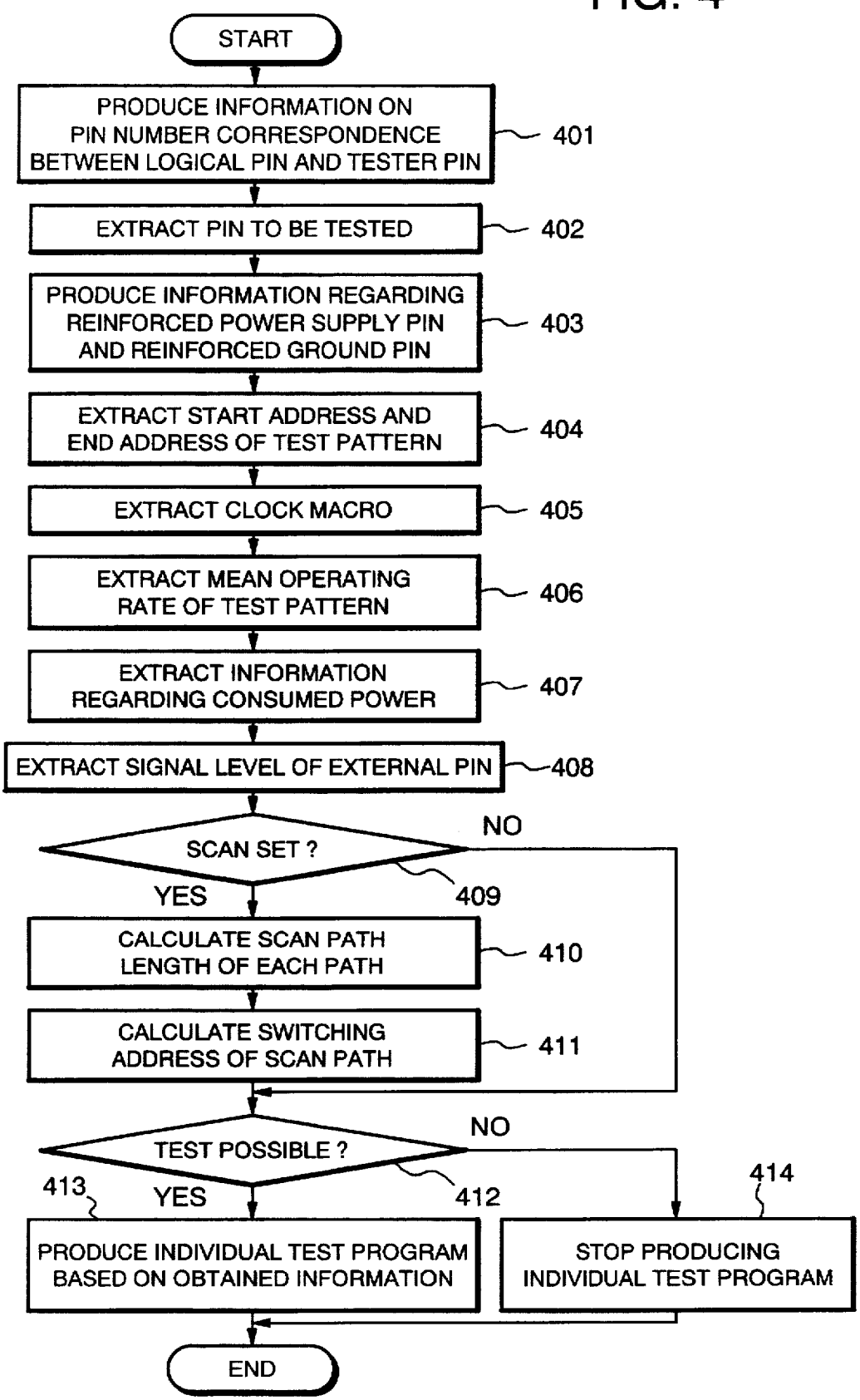
FIG. 4 is a flow chart showing operation of the second embodiment.

Description is next made of an individual test program producing procedure according to the present embodiment with reference to the flow chart of FIG. 4.

Operation at Steps 401 to 408 shown in FIG. 4 is the same as that at Steps 201 to 208 of the first embodiment shown in FIG. 2.

After information regarding necessary test items is produced by the test item information producing unit 11, upon detecting the circuit information 22 containing scan path information and information regarding the number of scan FFs, the scan path design determining unit 31 determines that an LSI to be examined is of scan design (Step 409). Then, based on scan FF order information indicative of the connection order of scan FFs, a scan path length of each path is calculated (Step 410). In addition, based on the pattern object information and the scan path information of the circuit information 22, a switching address of a scan path at the tester is calculated (Step 411).

On the other hand, when the scan path design determining unit 31 detects neither the scan path information nor the information regarding the number of scan FFs at the processing of Step 409 and determines that the LSI to be examined is not of scan design, no processing will be conducted to shift the routine to the processing of the test possibility/impossibility determining unit 12.

After the processing required for the case where an LSI to be examined is of scan design is conducted or after the determination is made that the LSI to be examined is not of scan design, the test possibility/impossibility determining unit 12 determines whether a test pattern overflows a memory capacity of the LSI tester based on the pattern object information of the circuit information 22 (Step 412). Then, if no overflow occurs, the individual test program producing unit 13 produces and outputs an individual test program (Step 413). If an overflow occurs, the unit 13 interrupts production of the individual test program (Step 414).

As described in the foregoing, since in addition to automatically producing an individual test program according to a kind of LSI to be examined and dealing with various kinds of LSIs to be examined with ease, the test program producing device 10 of the present embodiment conducts, when an LSI to be examined is of scan path design, necessary processing related to the switching of a scan path in advance, the device enables efficient production of an individual test program.

Figure 5:
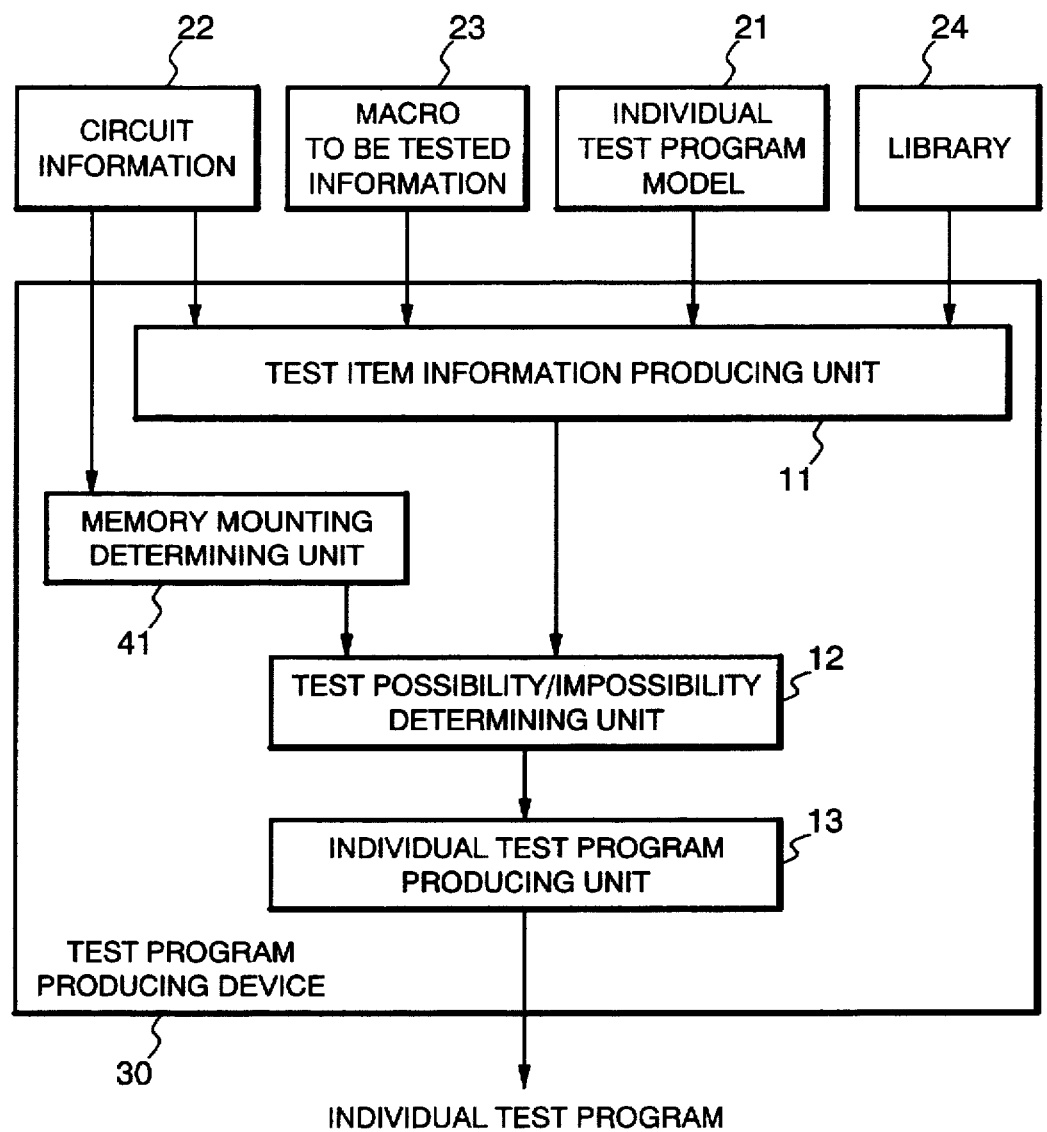
FIG. 5 is a block diagram showing structure of a test program producing device according to a third embodiment of the present invention.

FIG. 5 is a block diagram showing structure of an individual test program producing device according to a further embodiment of the present invention.

As illustrated in the figure, a test program producing device 40 of the present embodiment includes a test item information producing unit 11 for extracting and producing information regarding test items from various information, a memory mounting determining unit 41 for determining whether an internal memory is mounted on an LSI to be examined or not to conduct necessary processing, a test possibility/impossibility determining unit 12 for determining whether the size of a test pattern is too large or not, and an individual test program producing unit 13 for producing an individual test program by using information produced by the test item information producing unit. In FIG. 5, illustration is made only of a characteristic part of the structure of the present invention and that of the remaining common part is omitted.

The memory mounting determining unit 41, like the other components, is implemented by computer-program-controlled CPU and internal memory such as a RAM. When determining that an internal memory is mounted on the LSI to be examined, the memory mounting determining unit 41 calculates a coordinate position of the internal memory in the LSI and calculates the number of read data of a memory macro to further obtain a wire length for the memory macro.

The test item information producing unit 11, the test possibility/impossibility determining unit 12 and the individual test program producing unit 13 are the same as their counterparts in the first embodiment which have been described with reference to FIG. 1 and therefore allotted the same reference numerals to omit their description. Structure of a test program produced according to the present embodiment is also the same as that of the test program which has been described in the first embodiment and shown in FIG. 9.

Figure 6:
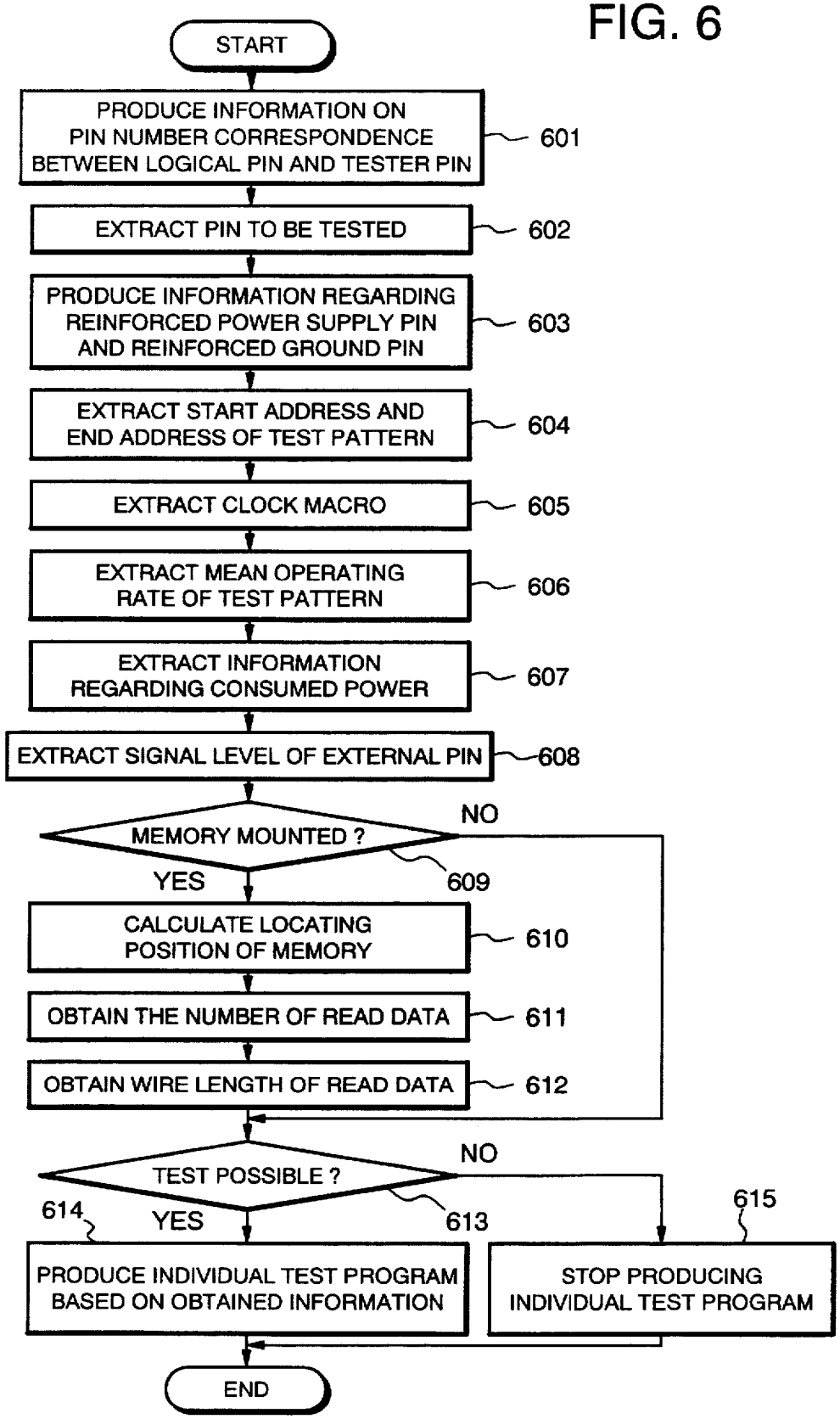
FIG. 6 is a flow chart showing operation of the third embodiment.

Description is next made of an individual test program producing procedure according to the present embodiment with reference to the flow chart of FIG. 6. Operation at Steps 601 to 608 shown in FIG. 6 is the same as that at Steps 201 to 208 of the first embodiment shown in FIG. 2.

After information regarding necessary test items is produced by the test item information producing unit 11, upon detecting a memory macro of the library 34 existing in the net list of the circuit information 22, the memory mounting determining unit 41 determines that an internal memory is mounted on the LSI to be examined (Step 609). Then, based on the layout information of the circuit information 22, a coordinate position of the internal memory in the LSI to be examined is obtained (Step 610). In addition, the number of read data of the memory macro existing in the net list of the circuit information 22 is counted and obtained (Step 611). Furthermore, a wire length for the memory macro detected in the net list of the circuit information 22 is extracted and obtained from the layout information of the circuit information 22 (Step 612).

On the other hand, when the memory mounting determining unit 41 detects no memory macro at the processing of Step 609 and determines that no internal memory is mounted on the LSI to be examined, no processing will be conducted to shift the routine to the processing of the test possibility/impossibility determining unit 12.

After the processing necessary for the case where an internal memory is mounted on the LSI to be examined is conducted or after the determination is made that an internal memory is not mounted on the LSI to be examined, the test possibility/impossibility determining unit 12 determines whether a test pattern overflows a memory capacity of the LSI tester based on the pattern object information of the circuit information 22 (Step 613). Then, if no overflow occurs, the individual test program producing unit 13 produces and outputs an individual test program (Step 614). If an overflow occurs, the unit 13 interrupts production of the individual test program (Step 615).

As described in the foregoing, since in addition to automatically producing an individual test program according to a kind of LSI to be examined and dealing with various kinds of LSIs to be examined with ease, the test program producing device 10 of the present embodiment conducts, when an internal memory is mounted on an LSI to be examined, processing for a memory macro in advance, the device enables efficient production of an individual test program.

Figure 7:
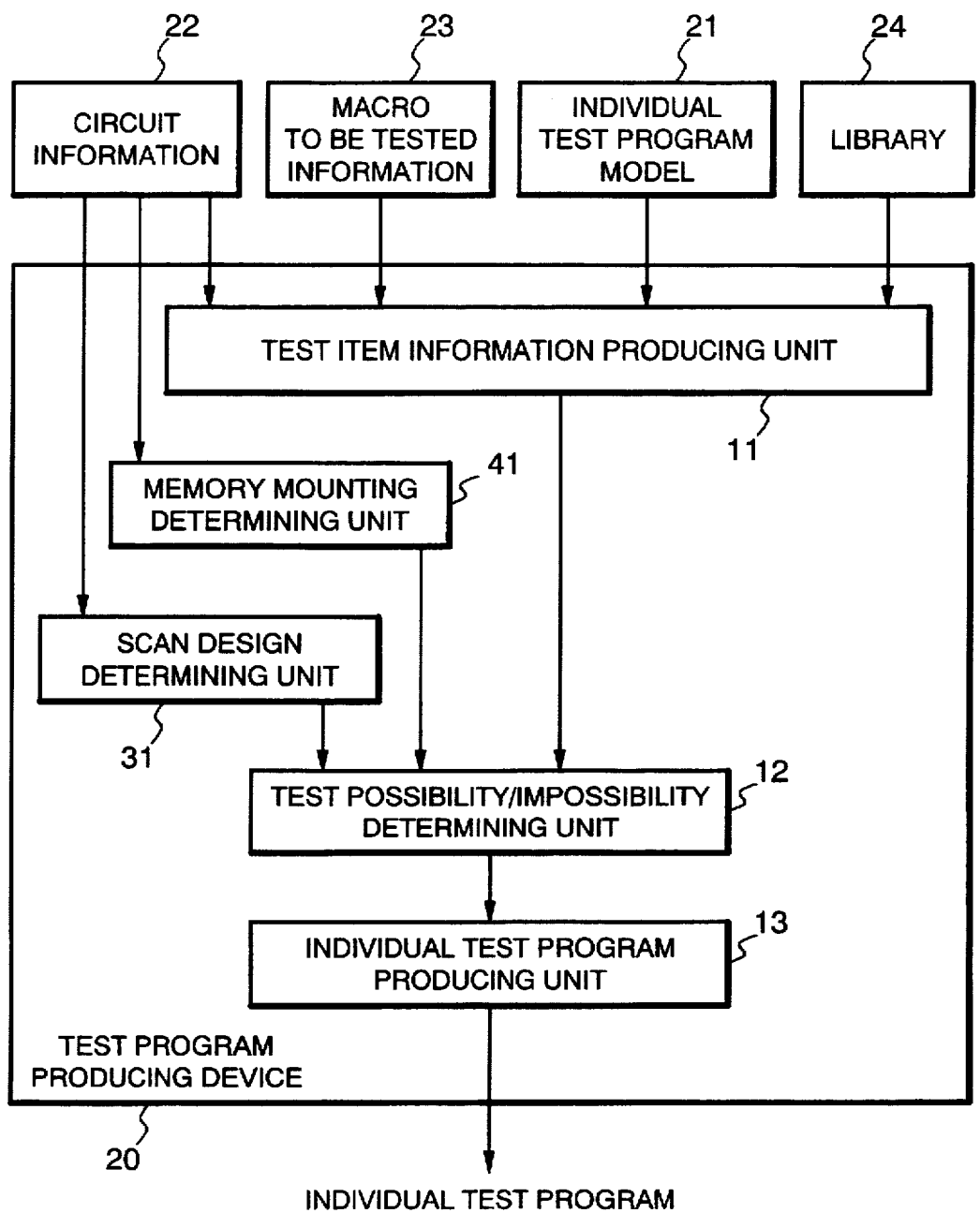
FIG. 7 is a block diagram showing structure of a test program producing device according to a fourth embodiment of the present invention.

FIG. 7 is a block diagram showing structure of an individual test program producing device according to a still further embodiment of the present invention.

As illustrated in the figure, a test program producing device 40 of the present embodiment includes a test item information producing unit 11 for extracting and producing information regarding test items from various information, a scan path design determining unit 31 for determining whether an LSI to be examined is of scan path design or not to conduct necessary processing, a memory mounting determining unit 41 for determining whether an internal memory is mounted on the LSI to be examined to conduct necessary processing, a test possibility/impossibility determining unit 12 for determining whether the size of a test pattern is too large or not, and an individual test program producing unit 13 for producing an individual test program by using information produced by the test item information producing unit. In FIG. 7, illustration is made only of a characteristic part of the structure of the present invention and that of the remaining common part is omitted.

In the above-described structure, the test item information producing unit 11, the test possibility/impossibility determining unit 12 and the individual test program producing unit 13 are the same as their counterparts in the first embodiment which have been described with reference to FIG. 1. The scan path design determining unit 31 is the same as the scan path design determining unit 31 of the second embodiment which has been described with reference to FIG. 3, while the memory mounting determining unit 41 is the same as the memory mounting determining unit 41 of the third embodiment which has been described with reference to FIG. 5. The same reference numerals are therefore allotted thereto to omit their description. Structure of the test program produced according to the present embodiment is also the same as that of the test program which has been described in the first embodiment and shown in FIG. 9.

Figure 8:
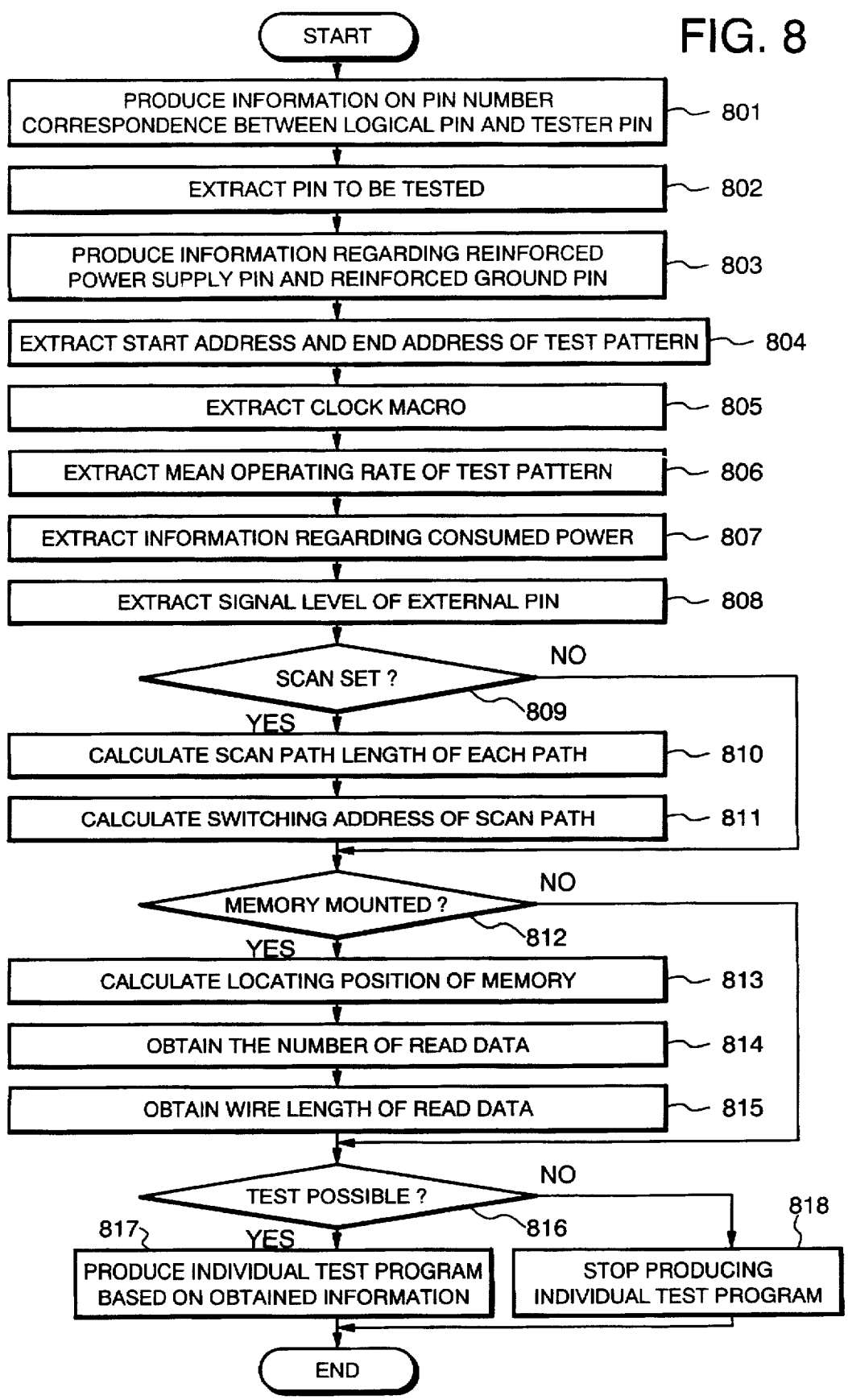
FIG. 8 is a flow chart showing operation of the fourth embodiment.

Description is next made of an individual test program producing procedure according to the present embodiment with reference to the flow chart of FIG. 8. Operation at Steps 801 to 808 shown in FIG. 4 is the same as that at Steps 201 to 208 of the first embodiment shown in FIG. 2.

After information regarding necessary test items is produced by the test item information producing unit 11, upon detecting the circuit information 22 containing scan path information and information regarding the number of scan FFs, the scan path design determining unit 31 determines that the LSI to be examined is of scan design (Step 809). Then, based on scan FF order information indicative of the connection order of scan FFs, a scan path length of each path is calculated (Step 810). In addition, based on the pattern object information and the scan path information of the circuit information 22, a switching address of a scan path at the tester is calculated (Step 811).

On the other hand, when the scan path design determining unit 31 detects neither the scan path information nor the information regarding the number of scan FFs at the processing of Step 809 and determines that the LSI to be examined is not of scan design, no processing will be conducted to shift the routine to the processing of the memory mounting determining unit 41.

After the processing necessary for the case where an LSI to be examined is of scan design is conducted or after the determination is made that the LSI to be examined is not of scan design, when the memory mounting determining unit 41 detects a memory macro of the library 34 existing in the net list of the circuit information 22, the unit 41 determines that an internal memory is mounted on the LSI to be examined (Step 812). Then, based on the layout information of the circuit information 22, a coordinate position of the internal memory in the LSI to be examined is obtained (Step 813). In addition, the number of read data of the memory macro existing in the net list of the circuit information 22 is counted and obtained (Step 814). Moreover, a wire length for the memory macro detected in the net list of the circuit information 22 is extracted and obtained from the layout information of the circuit information 22 (Step 815).

On the other hand, when the memory mounting determining unit 41 detects no memory macro at the processing of Step 812 and determines that no internal memory is mounted on the LSI to be examined, no processing will be conducted to shift the routine to the processing of the test possibility/impossibility determining unit 12.

After the processing necessary for the case where an internal memory is mounted on the LSI to be examined is conducted or after the determination is made that an internal memory is not mounted on the LSI to be examined, the test possibility/impossibility determining unit 12 determines whether a test pattern overflows a memory capacity of the LSI tester based on the pattern object information of the circuit information 22 (Step 816). Then, if no overflow occurs, the individual test program producing unit 13 produces and outputs an individual test program (Step 817). If an overflow occurs, the unit 13 interrupts production of the individual test program (Step 818).

As described in the foregoing, since in addition to automatically producing an individual test program according to a kind of LSI to be examined and dealing with various kinds of LSIs to be examined with ease, the test program producing device 10 of the present embodiment conducts, when an LSI to be examined is of scan path design, processing necessary for switching a scan path in advance, the device enables efficient production of an individual test program and also when an internal memory is mounted on an LSI to be examined, conducts processing for a memory macro in advance, the device enables efficient production of an individual test program as well.

As described in the foregoing, the test program producing device and the test program producing method of the present invention, at the time of producing an individual test program for use in an LSI test, enable automatic production of scan path length information, scan path switching information and reinforced power supply and reinforced ground information necessary as test items and embedding of the information in a model of the individual test program in addition to extraction of a pin to be tested, thereby avoiding erroneous production of various information, as well as enabling production of a test program even without experiences in producing numerous data or knowledge of test program formats.

In addition, by inputting individual data such as a net list of a circuit, scan order information, information on positional correspondence between a logical pin and a terminal, layout information, pattern object conversion information according to a kind of an LSI to be examined, the test program producing device and the test program producing method of the present invention enable production of an individual test program according to a kind of LSI to attain versatility.

Furthermore, according to the test program producing device and the test program producing method of the present invention, it is possible to eliminate such designing constraints on memory information as fixing of memory macro name and locating position and a read data pin name of each macro, as well as automatically producing memory test information by using location information of net list layout, wire information of layout and a memory macro library. It is therefore unnecessary to take a locating position of a memory macro and its read data order into account, which prevents a trouble from occurring in a test and further enables problem-free production of an individual test program even when circuit scale is increased.

Moreover, the test program producing device and the test program producing method of the present invention enable determination in advance whether an LSI test is possible or not by calculating a total memory capacity of a pattern object at an LSI tester which pattern object is for use in the LSI test. As a result, such processing as deletion of the number of test patterns at the time of a test and deletion of the number of test patterns can be omitted. Therefore, even when a test results in NG (defective), by inserting address information of a pattern object into an individual test program, the present invention is allowed to immediately detect a test pattern causing NG, thereby quickly coping with NG with ease.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. In a test of an LSI, a test program producing device for producing a test program for use in an individual test of an LSI to be examined, comprising:

test item information producing means for reading at least circuit information including information regarding concrete circuit specifications of an LSI to be examined, macro to be tested information which describes test items for each macro, and a necessary library, to produce necessary information regarding test items for said LSI to be examined;

test possibility/impossibility determining means for calculating a total capacity of an object of a test pattern in a test program to be produced and comparing the total capacity of the object with a memory capacity of a testing device which executes a test for said LSI to be examined to determine whether the test is possible or not based on the comparison results; and individual test program producing means for, when determination is made by said test possibility/impossibility determining means that a test is possible, embedding information regarding test items produced by said test item information producing means in a model of a test program prepared in advance to produce a test program for an individual test of said LSI to be examined.

2. The test program producing device as set forth in claim 1, wherein said test item information producing means obtains at least a corresponding relationship between a pattern address of a test pattern at a pattern object and a pattern address of a test pattern which is yet to be converted into a pattern object to obtain respective start addresses and end addresses of a plurality of test patterns to be executed by a produced test program.

3. The test program producing device as set forth in claim 1, further comprising:

scan path design determining means for determining whether said LSI to be examined is of scan path design and when said LSI is of scan path design, calculating the number of scan path bits of each scan path to calculate a scan path switching address of a pattern object, wherein said individual test program producing means embeds, in addition to the information produced by said test item information producing means, scan path length information and scan path switching address information calculated by said scan path design determining means in said test program model.

4. The test program producing device as set forth in claim 1, further comprising:

memory mounting determining means for determining whether an internal memory is mounted on said LSI to be examined or not and when an internal memory is mounted, calculating a coordinate position of the internal memory in the LSI, counting the number of read data of a memory macro and further obtaining a wire length for the memory macro, wherein said individual test program producing means embeds, in addition to the information produced by said test item information producing means, memory macro location information, number of read data information and read data wire length information obtained by said memory mounting determining means in said test program model.

5. The test program producing device as set forth in claim 1, further comprising:
scan path design determining means for determining whether said LSI to be examined is of scan path design and when said LSI is of scan path design, calculating the number of scan path bits of each scan path to calculate a scan path switching address of a pattern object, and
memory mounting determining means for determining whether an internal memory is mounted on said LSI to be examined or not and when an internal memory is mounted, calculating a coordinate position of the internal memory in the LSI, counting the number of read data of a memory macro and further obtaining a wire length for the memory macro, wherein
said individual test program producing means embeds, in addition to the information produced by said test item information producing means, scan path length information and scan path switching address information calculated by said scan path design determining means, and memory macro location information, number of read data information and read data wire length information obtained by said memory mounting determining means in said test program model.

6. In a test of an LSI, a test program producing method of producing a test program for use in an individual test of an LSI to be examined, comprising the steps of:
reading at least circuit information including information regarding concrete circuit specifications of an LSI to be examined, macro to be tested information which describes test items for each macro, and a necessary library, to produce necessary information regarding test items for said LSI to be examined;
calculating a total capacity of an object of a test pattern in a test program to be produced and comparing the total capacity of the object with a memory capacity of a testing device which executes a test for said LSI to be examined to determine whether the test is possible or not based on the comparison results; and
when determination is made by said test possibility/impossibility determining means that a test is possible, embedding information regarding test items produced by said test item information producing means in a model of a test program prepared in advance to produce a test program for an individual test of said LSI to be examined.

7. The test program producing method as set forth in claim 6, wherein
at said test item information producing step, at least a corresponding relationship between a pattern address of a test pattern at a pattern object and a pattern address of a test pattern which is yet to be converted into a pattern object is obtained to obtain respective start addresses and end addresses of a plurality of test patterns to be executed by a produced test program.

8. The test program producing method as set forth in claim 6, further comprising
between said test item information producing step and said test possibility/impossibility determining step, the steps of:
determining whether said LSI to be examined is of scan path design,
calculating the number of scan path bits of each scan path when the LSI is of scan path design, and
calculating a scan path switching address of a pattern object, wherein
at said individual test program producing step, scan path length information calculated at said scan path bit calculating step and scan path switching address information calculated at said scan path switching address calculating step is embedded in said test program model, in addition to the information produced at said test item information producing step.

9. The test program producing method as set forth in claim 6, further comprising
between said test item information producing step and said test possibility/impossibility determining step, the steps of:
determining whether an internal memory is mounted on said LSI to be examined,
when an internal memory is mounted on said LSI, calculating a coordinate position of the internal memory in the LSI,
counting the number of read data of a memory macro, and
obtaining a wire length for the memory macro, wherein
at said individual test program producing step, memory macro location information calculated at said internal memory coordinate position calculating step, number of read data information obtained at said number of read data counting step, and read data wire length information obtained at said wire length obtaining step is embedded in said test program model, in addition to the information produced at said test item information producing step.

10. The test program producing method as set forth in claim 6, further comprising
between said test item information producing step and said test possibility/impossibility determining step, the steps of:
determining whether said LSI to be examined is of scan path design,
calculating the number of scan path bits of each scan path when the LSI is of scan path design, and
calculating a scan path switching address of a pattern object, and further comprising the steps of:
determining whether an internal memory is mounted on said LSI to be examined,
when an internal memory is mounted on said LSI, calculating a coordinate position of the internal memory in the LSI,
counting the number of read data of a memory macro, and
obtaining a wire length for the memory macro, wherein
at said individual test program producing step, scan path length information calculated at said scan path bit calculating step, scan path switching address information calculated at said scan path switching address calculating step, memory macro location information obtained at said internal memory coordinate position calculating step, number of read data information obtained at said number of read data counting step and read data wire length information obtained at said wire length obtaining step is embedded in said test program model, in addition to the information produced at said test item information producing step.

11. In a test of an LSI, a computer readable memory which stores a control program for controlling a test program producing device which produces a test program for use in an individual test of an LSI to be examined, said control program comprising the steps of:

reading at least circuit information including information regarding concrete circuit specifications of an LSI to be examined, macro to be tested information which describes test items for each macro, and a necessary library, to produce necessary information regarding test items for said LSI to be examined;

calculating a total capacity of an object of a test pattern in a test program to be produced and comparing the total capacity of the object with a memory capacity of a testing device which executes a test for said LSI to be examined to determine whether the test is possible or not based on the comparison results; and when determination is made at said test possibility/impossibility determining step that a test is possible, embedding information regarding test items produced by said test item information producing means in a model of a test program prepared in advance to produce a test program for an individual tesst of said LSI to be examined.

12. The computer readable memory as set forth in claim 11, wherein at said test item information producing step of said control program, at least a corresponding relationship between a pattern address of a test pattern at a pattern object and a pattern address of a test pattern which is yet to be converted into a pattern object is obtained to obtain respective start addresses and end addresses of a plurality of test patterns to be executed by a produced test program.

13. The computer readable memory as set forth in claim 11, wherein said control program further comprising between said test item information producing step and said test possibility/impossibility determining step, the steps of:

determining whether said LSI to be examined is of scan path design, calculating the number of scan path bits of each scan path when the LSI is of scan path design, and calculating a scan path switching address of a pattern object, wherein at said individual test program producing step, scan path length information calculated at said scan path bit calculating step and scan path switching address information calculated at said scan path switching address calculating step is embedded in said test program model, in addition to the information produced at said test item information producing step.

14. The computer readable memory as set forth in claim 11, wherein said control program further comprising between said test item information producing step and said test possibility/impossibility determining step, steps of:

determining whether an internal memory is mounted on said LSI to be examined, when an internal memory is mounted on said LSI, calculating a coordinate position of the internal memory in the LSI, counting the number of read data of a memory macro, and obtaining a wire length for the memory macro, wherein at said individual test program producing step, memory macro location information obtained at said internal memory coordinate position calculating step, number of read data information obtained at said number of read data counting step, and read data wire length information obtained at said wire length obtaining step is embedded in said test program model, in addition to the information produced at said test item information producing step.

15. The computer readable memory as set forth in claim 11, wherein said control program further comprising between said test item information producing step and said test possibility/impossibility determining step, steps of:

determining whether said LSI to be examined is of scan path design, calculating the number of scan path bits of each scan path when the LSI is of scan path design, and calculating a scan path switching address of a pattern object, and further comprising the steps of:

determining whether an internal memory is mounted on said LSI to be examined, when an internal memory is mounted on said LSI, calculating a coordinate position of the internal memory in the LSI counting the number of read data of a memory macro, and obtaining a wire length for the memory macro, wherein at said individual test program producing step, scan path length information calculated at said scan path bit calculating step, scan path switching address information calculated at said scan path switching address calculating step, memory macro location information obtained at said internal memory coordinate position calculating step, number of read data information obtained at said number of read data counting step and read data wire length information obtained at said wire length obtaining step is embedded in said test program model, in addition to the information produced at said test item information producing step.

* * * * *